(12) United States Patent
Haroun et al.

(10) Patent No.: US 6,720,959 B2
(45) Date of Patent: Apr. 13, 2004

(54) AREA EFFICIENT, LOW POWER AND FLEXIBLE TIME DIGITIZER

(75) Inventors: Baher Haroun, Allen, TX (US); Heng-Chih Lin, Plano, TX (US); Tim Foo, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/291,997

(22) Filed: Nov. 12, 2002

(65) Prior Publication Data

US 2003/0184393 A1 Oct. 2, 2003

Related U.S. Application Data

(60) Provisional application No. 60/368,240, filed on Mar. 28, 2002.

(51) Int. Cl.[7] .................................................. G09G 5/00
(52) U.S. Cl. ....................................... 345/213; 331/57
(58) Field of Search .................. 331/57, 100; 345/213, 345/133; 375/376; 327/156, 157, 158

(56) References Cited

U.S. PATENT DOCUMENTS

| | | | | | |
|---|---|---|---|---|---|
| 4,677,648 | A | * | 6/1987 | Zurfluh | 375/376 |
| 5,444,459 | A | * | 8/1995 | Moriyasu | 345/440.1 |
| 6,628,276 | B1 | * | 9/2003 | Elliott | 345/213 |

* cited by examiner

Primary Examiner—Robert Pascal
Assistant Examiner—Joseph Chang
(74) Attorney, Agent, or Firm—Ronald O. Neerings; Wade James Brady, III; Frederick J. Telecky, Jr.

(57) ABSTRACT

A non-linear time digitizer delay chain and a respective lookup table for converting the phase error into a digital code together prevent a phase error pulse from saturating the delay chain, even when the input frequency varies by orders of magnitude. By using a non-linear T2D delay chain along with a corresponding lookup table, the phase error pulse associated with a digital phase lock loop (PLL) can be measured and represented in more meaningful and accurate ways that that achievable when using a conventional T2d circuit to convert the phase error into a digital code. The lookup table implementation allows an additional degree of freedom for designers to apply a transfer function to the digital code measured by the T2D.

19 Claims, 3 Drawing Sheets

AREA EFFICIENT, LOW POWER AND FLEXIBLE TIME DIGITIZER

CLAIM TO PRIORITY OF PROVISIONAL APPLICATION

This application claims priority under 35 U.S.C. §119(e)(1) of provisional application Ser. No. 60/368,240, filed Mar. 28, 2002, by Heng-Chih Lin, Baher S. Haroun and Tim Foo.

BACKGROUND OF THE INVENTION

1. Field of the Invention

This invention relates generally to any system that requires obtaining a digital measurement of the duration of a pulse over a large range of pulse widths that can span orders of magnitude. The range is determined by the ratio of longest pulse width to the shortest one to be measured. More particularly, this invention applies to a non-linear time digitizer delay chain and a respective lookup table for converting a pulse with a specific time duration into a digital code. The error in measuring the time duration of the pulse width in this invention is bounded to be below a fixed percentage of the pulse duration. Measurements of the duration of a pulse width, such as phase error, are typically needed in common systems such as digital phase or delay locked loops.

2. Description of the Prior Art

Digital time measurement has been commonly used in digital phase locked loop implementations. Many designers have chosen a complete digital phase lock loop (DPLL) approach to address requirements such as wide range of input clock frequency, low power supply voltage, wide processing and temperature variations versus an alternative traditional analog implementation of the phase locked loop (APLL). Such digital phase lock loops (DPLLs) are running entirely in the digital domain except for the digitally-controlled oscillator (DCO). Traditionally, some sort of time digitizer (T2D) circuit is employed to convert the phase error into a digital code. This is problematic however, as the input frequency can sometimes vary by orders of magnitude, where the design of the T2D delay chain becomes more challenging as more and more delay buffers are added to cover longer range of pulse durations in order to prevent the phase error pulse from saturating the delay chain. This linear growth with pulse duration will require a linear increase in the number of buffers used and hence increases both silicon area as well as power consumption.

It is therefore advantageous and desirable to provide a technique of implementing a time digitizer delay chain for converting the phase error associated with a digital PLL into a digital code in a way that prevents a phase error pulse from saturating the delay chain, even when the input frequency varies by orders of magnitude. It would be further advantageous and desirable if the time digitizer delay chain were to be implemented in a fashion to minimize required silicon area as well power consumption.

SUMMARY OF THE INVENTION

The present invention is directed to a non-linear time digitizer delay chain and a respective lookup table for converting a pulse width into a digital code, and that together prevent a pulse from saturating the delay chain, even when the pulse duration varies by orders of magnitude. By using a non-linear T2D delay chain along with a corresponding lookup table, the pulse width can be measured and represented in more meaningful and accurate ways to that achievable when using a conventional T2D circuit to convert the pulse width into a digital code. The total delay chain can be partitioned into small piece-wise linear delay segments while keeping the total number of digital codes required to a minimum. Without increasing the complexity of interface routing between the T2D and its associated digital controller, the digital code is converted through a lookup table to recover the actual pulse duration information. More importantly, the lookup table implementation allows an additional degree of freedom for designers to apply a transfer function to the digital code measured by the T2D. For example, such a function can behave as a pre-emphasis filter that will improve or compensate for the loop gain or correct for circuit non-linearity.

According to one embodiment, a time digitizer system comprises a delay chain configured to generate a different code corresponding to monotonically increasing (for example exponenetial) pulse durations. Corresponding to each of these digital codes a digital value is entered in a look-up-table. Hence, for a range of pulse durations, there is a unique code generated from the combined look-up-table and delay chain. This combined operation can generate any time to digital transfer function to achieve desired mapping of pulse duration and corresponding digital code.

One embodiment of this invention is by using a mapping of exponentially increasing pulse width durations to an intermediate digital code, which is logarithmically related to the pulse width duration. After the look-up-table, this intermediate code is transformed to an output code that is linearly related to the original pulse duration. The advantage of using this logarithmic compression and further exponential expansion of codes is that the size and power required for the implementation can grow only logarithmically with the range of pulse duration while maintaining a measurement resolution that is bounded to be below a fixed percentage of the pulse duration.

According to yet another embodiment, a time digitizer system comprises a delay chain having a first transfer function and configured to generate a intermediate digital code in response a pulse duration; and a look-up table comprising data associated with a second transfer function, such that the intermediate digital code is modified by the second transfer function data to provide a final digital code.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
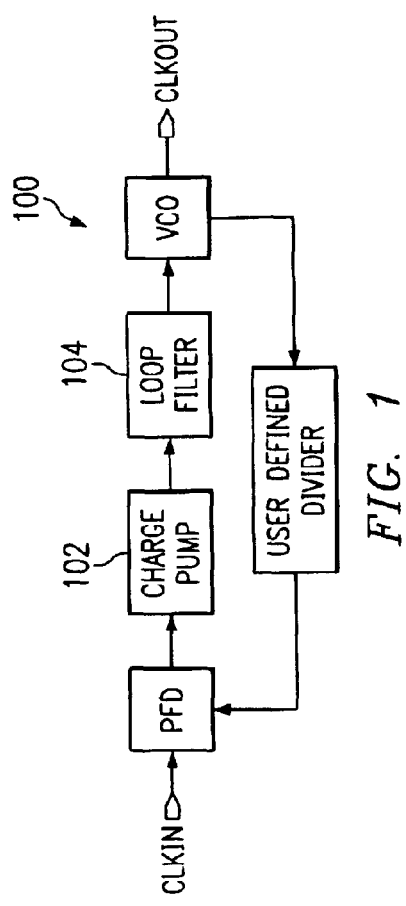
FIG. 1 is a block diagram illustrating a typical analog phase lock loop.

FIG. 1 depicts a conventional analog phase lock loop (PLL) 100. In a digital PLL, the charge pump 102 and the loop filter 104 are replaced with a digital control circuit.

Figure 2:
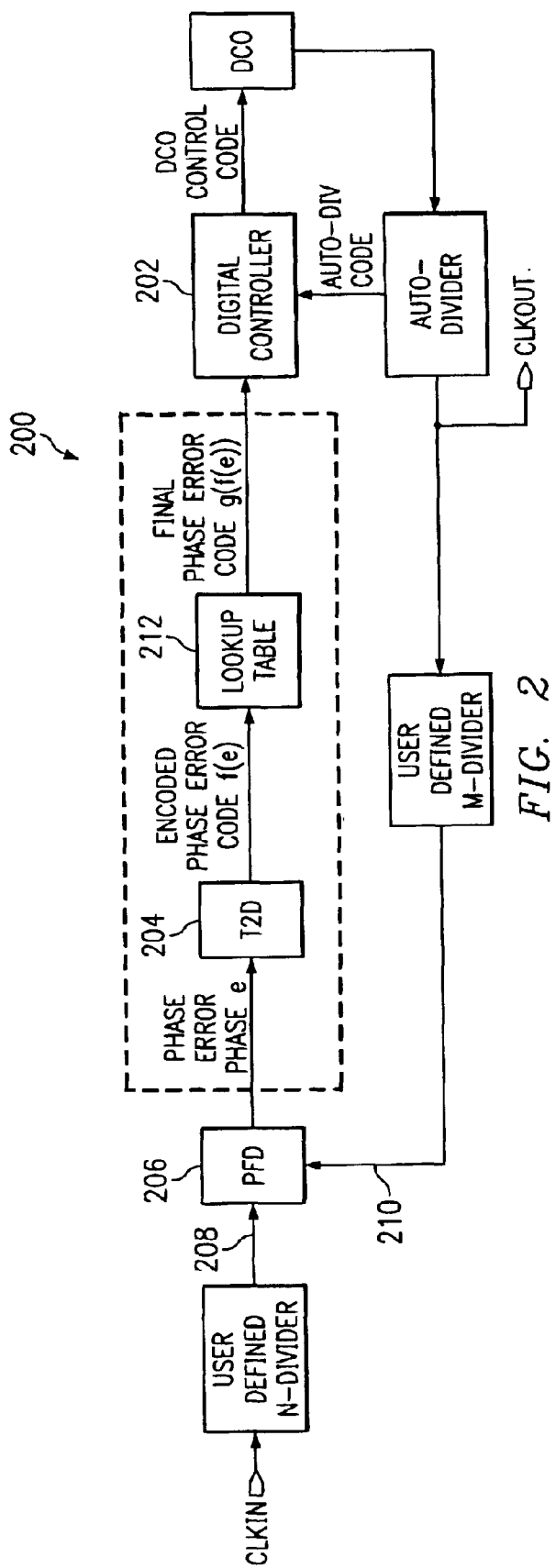
FIG. 2 is a simplified block diagram illustrating an all digital phase lock loop (ADPLL)

FIG. 2 is a simplified block diagram illustrating an all digital phase lock loop (ADPLL) 200, having a digital control circuit 202 that acts on the phase frequency difference to control the output frequency of the PLL 200. In order to support digital signal processors (DSPs) associated with wireless communication standards allowing a wide range of input clock frequencies, the time digitizer (T2D) 204 delay chain must be long enough to cover the lowest clock frequency the DPLL 200 is designed to work at. On the other hand, the T2D 204 must also have a sufficient resolution to achieve a target jitter specification when the DPLL 200 acquires a lock. The particular embodiments of the invention described herein below with reference to FIGS. 2–5 provide a solution to these two conflicting requirements, allowing a DPLL to support a wide range on input clock frequencies while achieving a targeted jitter performance.

Figure 3:
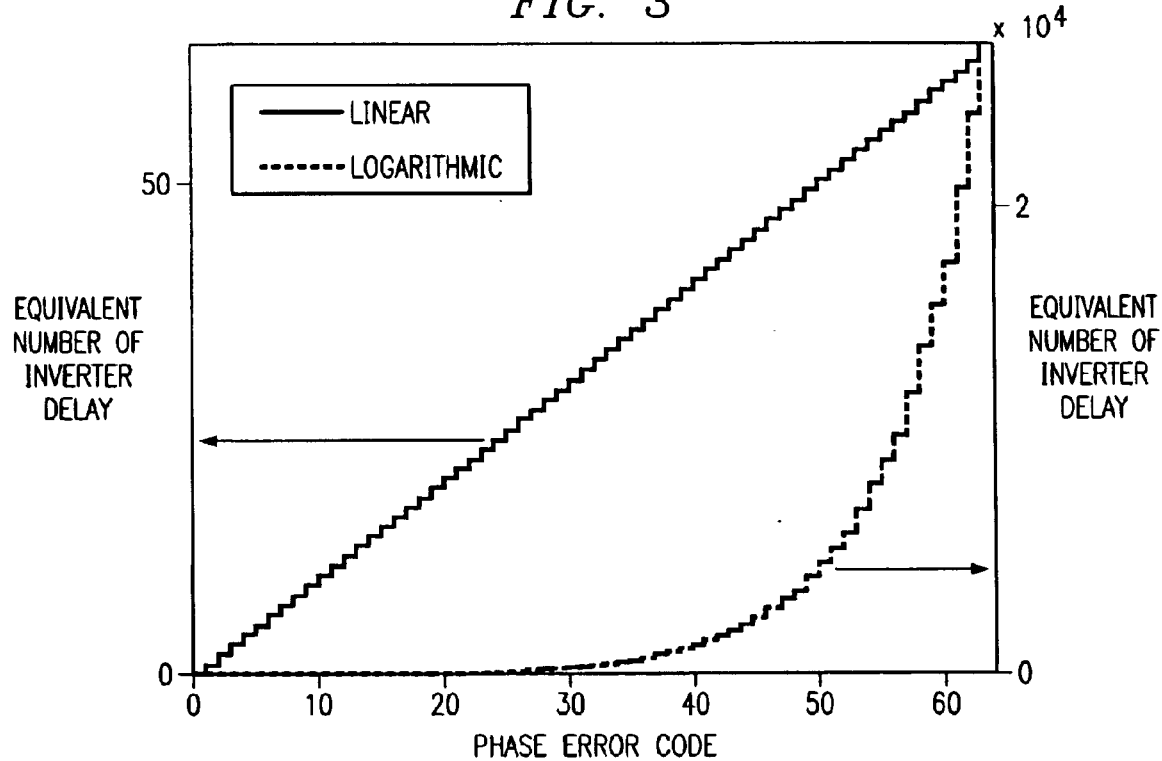
FIG. 3 is a graph depicting a phase error code as a function of updown pulse width for both a logarithmic delay chain and a non-logarithmic delay chain.

A digital phase lock loop (DPLL), according to one embodiment, can achieve 0.5% jitter with a 50 MHz input clock while operating with an acceptable lock time at 500 kHz by employing a unit delay of 35 ps such that the entire delay chain will require 27000 unit delays. Instead of using 27000 unit delay elements however, a total delay of only 945 ns can instead be used to achieve the requisite target jitter by using a T2D delay chain with a logarithmic function f(e), and a unit delay with an accuracy of 35 ps. FIG. 3 is a graph depicting the phase error code as a function of updown pulse width for both a logarithmic delay chain and a non-logarithmic delay chain. FIG. 3 illustrates the benefits of this implementation where the total digital phase error code remains at 64 while the equivalent number of unit delays each digital code represent grows exponentially.

Figure 4:
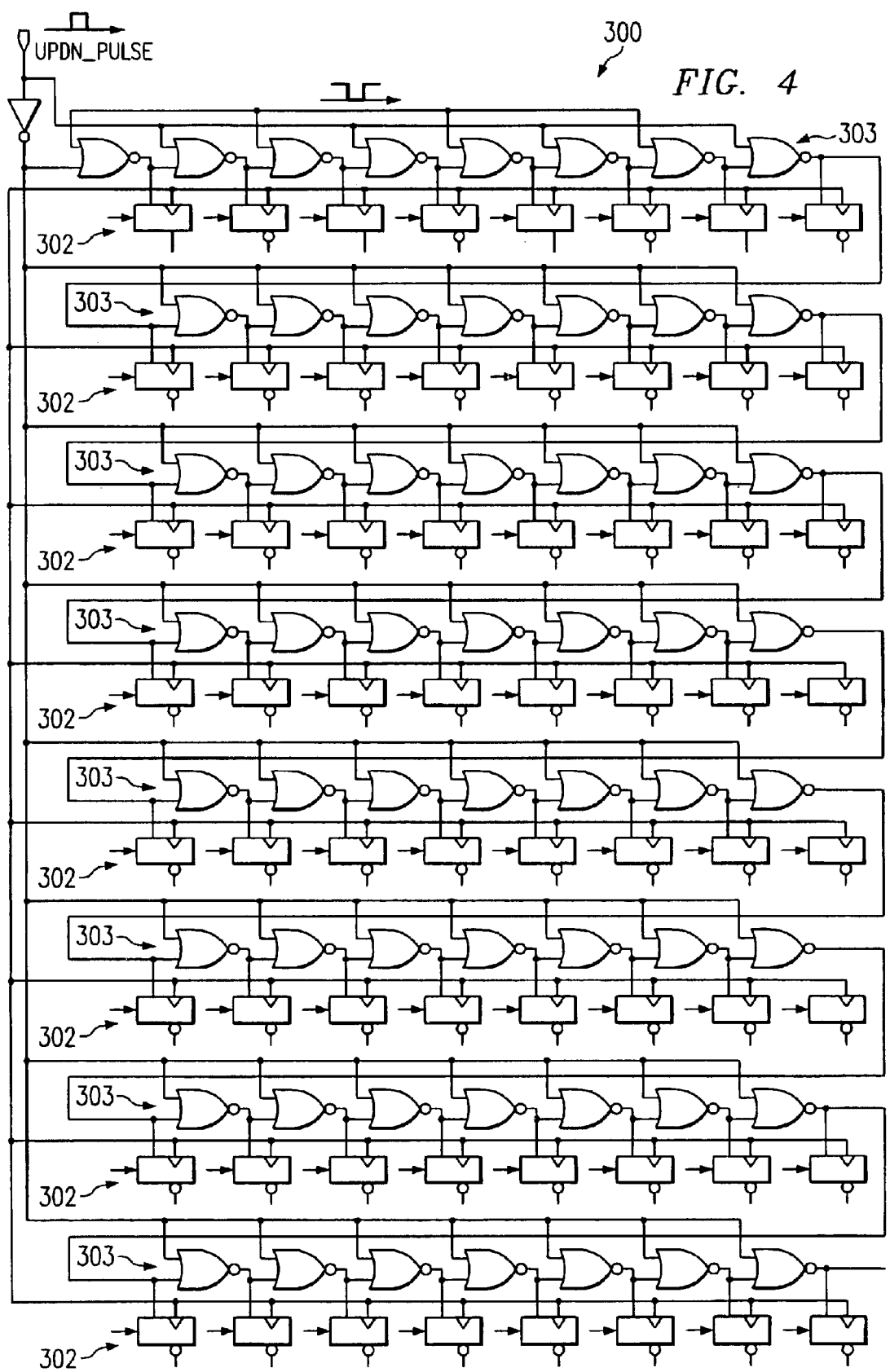
FIG. 4 illustrates a logarithmic time digitizer having 35 psec accuracy.

FIG. 4 illustrates a logarithmic time digitizer 300 having 35 psec accuracy. This embodiment uses 16 segments, within each segment are four delay elements, each is comprised of a latch 302 and a gate 303, to provide a T2D delay chain that implements the logarithmic function, f(e).

Looking again at FIG. 2, the phase difference between the reference clock 208 and the feedback clock 210 is typically measured at the PFD circuit 206 from the rising edge of the reference clock 208 to the rising edge of the feedback clock 210. This phase error pulse is then fed into the delay chain 204. This design implements a self latching circuit that gives a 64-bit thermo code output at the end of the phase error pulse. Sixty-four (64) thermo codes are used to record the phase error pulse that propagate through the logarithmic delay chain 204. A zero (0) code represents a phase difference pulse having less than the unit delay 35 ps; while a 63 code represents a pulse of 27000×35 ps. The total delay is given by $$\sum_{0}^{i} 4 \times 2i \times D_{min},$$

where i ranges from 0 to 15.

Each gate 303 is most preferably implemented using CMOS NOR gate with its width/length (W/L) carefully tuned to achieve the proper delay factor without any significant increase in silicon area. The latches (302), latch the value of the pulse through the delay chain formed with the gates 303 at the end of the pulse width. The extended delay chain then provides a way to increase the detectable range of the phase error pulse width without sacrificing the accuracy of the T2D 204 when the DPLL 200 is locked. Further, this implementation reduces the total area requirements, number of required components, power consumption and design complexity.

This 64-bit thermometer code goes through bubble correction, thermometer to binary conversion before being registered at the falling edge of the reference clock. By using the binary coded representation of the phase error, a reduction is achieved with respect to the routing area and signal interface between the T2D circuit 204 and the digital controller 202. Before this logarithmic phase error code is passed to the digital controller 202, a lookup table (LUT) 212 is used to implement a second transfer function, g(f(e)). This transfer function allows another degree of freedom for the designer to either linearize the logarithmic phase error code, or even implement some type of pre-emphasis function to correct for the loop gain.

Figure 5:
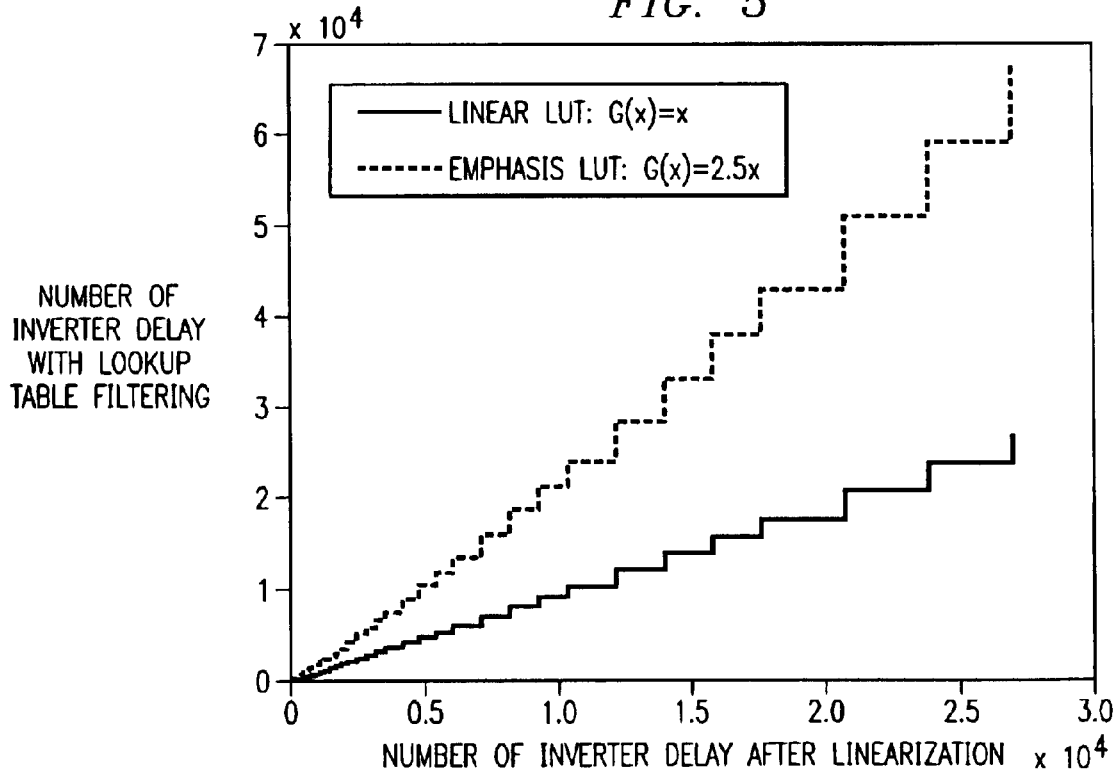
FIG. 5 is a graph illustrating the impact that a flexible transfer function, implemented through a lookup table, has on the number of inverter delays associated with a time digitizer circuit.

FIG. 5 illustrates two examples of a flexible transfer function which could be applied to the linearized phase error code. With a simple g(x)=2.5x function, the control loop effectively achieves a 2.5 times increase in the loop gain which might be desirable when the reference clock 208 and the feedback clock 210 are significantly apart from each other. Subsequent to implementing the LUT 212, and with or without any filtering function applied, the actual phase error pulse width information is recovered; and the proper control loop correction can thus be applied. The depth of the LUT 212 is determined by the range of the binary phase error code, which is 64 in this embodiment; and the output comprises 15-bit wide data. The LUT 212 can therefore be scamlessly integrated into the design of the digital controller 202 with minimum overhead.

In summary explanation, a digital phase lock loop (DPLL) offers key advantage compared to an analog PLL using analog control voltage, because T2D phase error codes are less susceptible to noise; and the subsequent control algorithm can be carried out in the digital domain. Digital phase lock loops also offer a superior implementation in a high gate density deep-submicron CMOS process. The T2D is carefully designed to have fine resolution for high input frequency applications while capable of handling the wide delay range required to effectively operate in a low input frequency application without saturating the delay chain. The present inventors have found that a wide input range DPLL 200 can be designed with a logarithmic delay chain T2D 204, 300 to support a wide range of input frequencies; while the effects of process, voltage and temperature variations can be eased by using a digital controller as well as other mean of calibration and loop bandwidth normalization of the DPLL 200.

In view of the above, it can be seen the present invention presents a significant advancement in the art of digital phase lock loops. It is also possible to use the same T2D structures in other types of systems that require a large range of time where an almost relative constant accuracy is maintained while still obtaining the finest resolution when measuring the smallest time periods. Further, this invention has been described in considerable detail in order to provide those skilled in the time digitizer art with the information needed to apply the novel principles and to construct and use such specialized components as are required.

Further, in view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A time digitizer system comprising:
    a delay chain configured to generate a logarithmic code in response to a pulse of a specific time width; and
    a look-up table comprising desired transfer function data such that the logarithmic code is modified by the desired transfer function data to provide a final code.

2. The time digitizer system according to claim 1 wherein the delay chain comprises a plurality of CMOS NOR gates, wherein each gate has a width/length ratio tuned to achieve a desired delay factor.

3. The time digitizer system according to claim 1 wherein the desired transfer function data is configured to linearize the logarithmic code.

4. The time digitizer system according to claim 1 wherein the desired transfer function data is configured to provide a predetermined pre-emphasis function such that the logarithmic code is corrected for a defined loop gain.

5. A time digitizer system comprising:
    a delay chain configured to generate a logarithmic phase error code in response to a pulse of a specific time width corresponding to a phase difference between a reference clock and a feedback clock; and
    a look-up table comprising desired transfer function data such that the logarithmic phase error code is modified by the desired transfer function data to provide a final error code.

6. The time digitizer system according to claim 5 wherein the first transfer function is defined by a logarithmic relationship.

7. The time digitizer system according to claim 5 wherein the combined transfer function is defined by at least one relationship selected from the group consisting of linear, logarithmic, monotonic and emphasized.

8. The time digitizer system according to claim 5 wherein the delay chain comprises a plurality of CMOS NOR gates, wherein each gate has a width/length ratio tuned to achieve a desired delay factor.

9. A time digitizer system comprising:
    a delay chain having a first transfer function and configured to generate a phase error code in response a phase error pulse; and
    a look-up table comprising data associated with a second transfer function, such that the phase error code is modified by the second transfer function data to provide a final phase error code.

10. The time digitizer system according to claim 9 wherein the first transfer function and the second transfer function together form a combined transfer function to generate the final phase error code in response to the phase error pulse.

11. The time digitizer system according to claim 9 wherein the first transfer function is defined by a logarithmic relationship.

12. The time digitizer system according to claim 9 wherein the second transfer function is defined by at least one relationship selected from the group consisting of linear, logarithmic, and emphasis.

13. The time digitizer system according to claim 9 wherein the delay chain comprises a plurality of CMOS NOR gates, wherein each gate has a width/length ratio tuned to achieve a desired delay factor.

14. The digitizer system according to claim 9 further comprising a phase frequency difference element configured to generate the phase error pulse in response to a phase difference between a reference clock and a feedback clock.

15. The digitizer system according to claim 14 further comprising a digital controller configured to generate a digital controlled oscillator control signal in response to the final phase error code.

16. The digitizer system according to claim 15 further comprising:
    a digitally controlled oscillator (DCO) configured to generate a clocked output signal in response to the digital controlled oscillator control signal; and
    a feedback loop configured to generate the feedback clock in response to the clocked output signal, wherein the phase frequency difference element, delay chain, look-up table, digital controller, DCO, and feedback loop combine to implement a phase lock loop.

17. A method of encoding a phase error pulse, the method comprising the steps of:
    generating a phase error pulse in response to a difference between a reference clock and a feedback clock;
    generating an encoded phase error code via a time digitizer in response to the phase error pulse; and
    modifying the encoded phase error code via look-up table data to provide a final phase error code.

18. The method according to claim 17 wherein the step of generating an encoded phase error code via a logarithmic time digitizer comprises passing the phase error pulse through a logarithmic delay chain.

19. The method according to claim 17 wherein the step of modifying the encoded phase error code via look-up table data comprises processing the encoded phase error code via at least one transfer function selected from the group consisting of linear, logarithmic, and pre-emphasis.

* * * * *